United States Patent
Lee

(10) Patent No.: US 9,818,865 B2
(45) Date of Patent: Nov. 14, 2017

(54) SEMICONDUCTOR DEVICE INCLUDING A PIPE CHANNEL LAYER HAVING A PROTRUDING PORTION

(71) Applicant: SK hynix Inc., Gyeonggi-do (KR)

(72) Inventor: Hyun Ho Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/215,362

(22) Filed: Jul. 20, 2016

(65) Prior Publication Data

US 2017/0243972 A1 Aug. 24, 2017

(30) Foreign Application Priority Data

Feb. 22, 2016 (KR) .................. 10-2016-0020751

(51) Int. Cl.

| | |
|---|---|
| H01L 29/78 | (2006.01) |
| H01L 27/11556 | (2017.01) |
| H01L 27/11582 | (2017.01) |
| H01L 27/24 | (2006.01) |
| H01L 29/423 | (2006.01) |
| H01L 29/10 | (2006.01) |

(52) U.S. Cl.
CPC .... *H01L 29/7827* (2013.01); *H01L 27/11556* (2013.01); *H01L 27/11582* (2013.01); *H01L 27/2454* (2013.01); *H01L 29/1037* (2013.01); *H01L 29/42356* (2013.01)

(58) Field of Classification Search
CPC ......... H01L 27/11582; H01L 29/66825; H01L 29/66833; H01L 29/7827; H01L 29/1037; H01L 29/42356; H01L 27/11556; H01L 27/115582; H01L 27/2454

See application file for complete search history.

(56) References Cited

U.S. PATENT DOCUMENTS

| | | | | |
|---|---|---|---|---|
| 2012/0273865 | A1* | 11/2012 | Lee ................... | H01L 27/11582 257/316 |
| 2013/0153978 | A1* | 6/2013 | Lee ................... | H01L 29/66833 257/314 |

FOREIGN PATENT DOCUMENTS

| | | |
|---|---|---|
| KR | 1020130070922 | 6/2013 |
| KR | 1020160001408 | 1/2016 |

* cited by examiner

Primary Examiner — Tucker J Wright
(74) Attorney, Agent, or Firm — IP & T Group LLP

(57) ABSTRACT

Disclosed is a semiconductor device, including: a first pipe gate; a second pipe gate on the first pipe gate; a stacked structure on the second pipe gate; a first channel layer including a first pipe channel layer positioned within the first pipe gate and first cell channel layers connected to the first pipe channel layer; a second channel layer including a second pipe channel layer positioned within the second pipe gate, and second cell channel layers connected to the second pipe channel layer; and a slit insulating layer passing through the stacked structure and positioned between the adjacent second cell channel layers, wherein the second pipe channel layer has a body portion and a protrusion portion extending below the body portion at a position below the slit insulating layer.

18 Claims, 13 Drawing Sheets

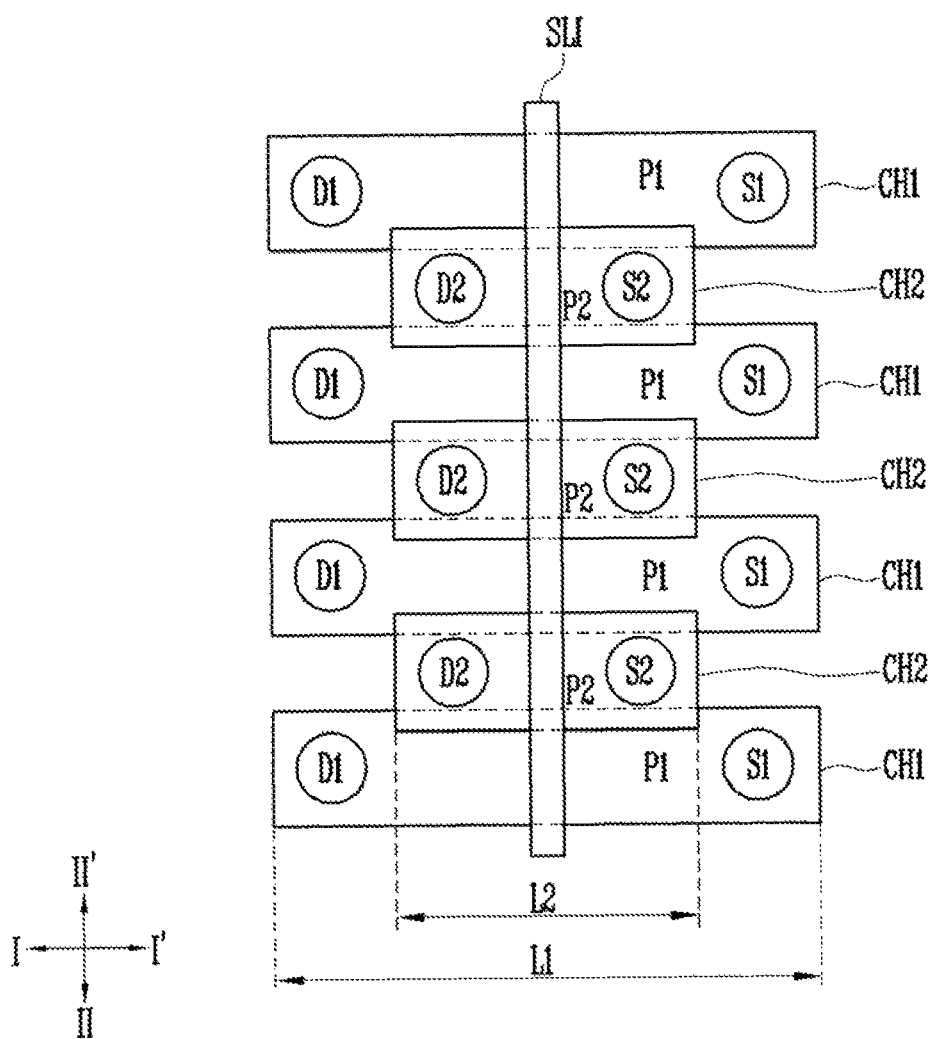

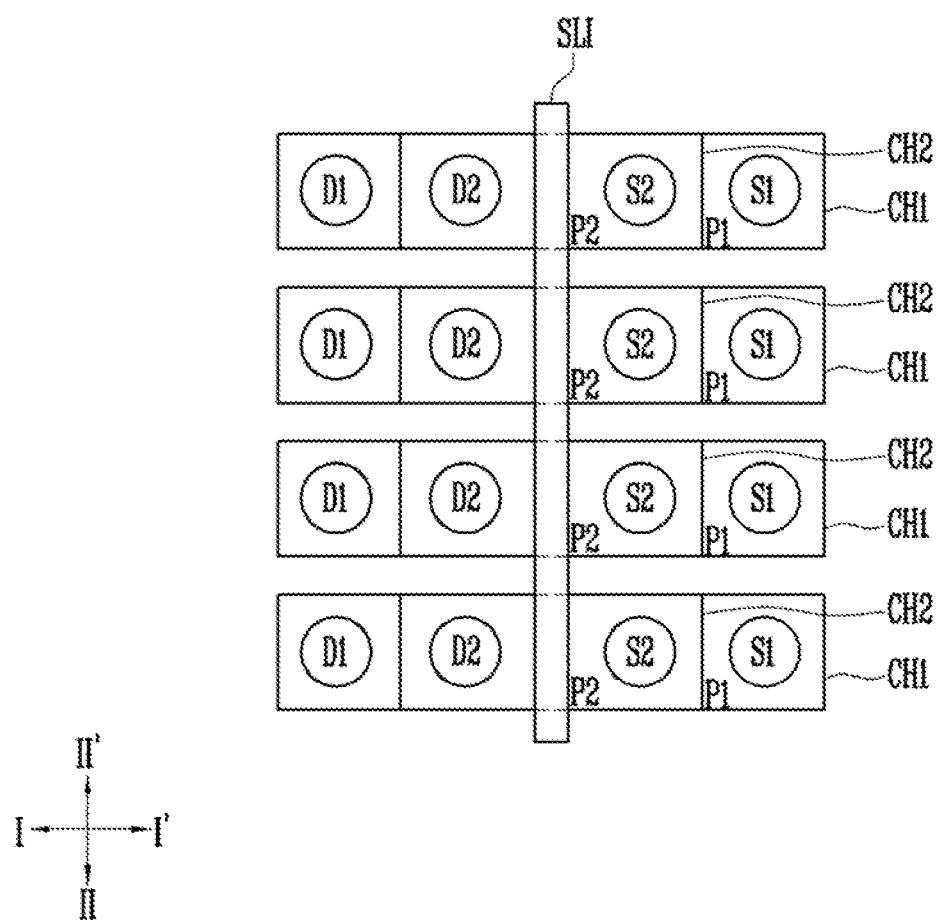

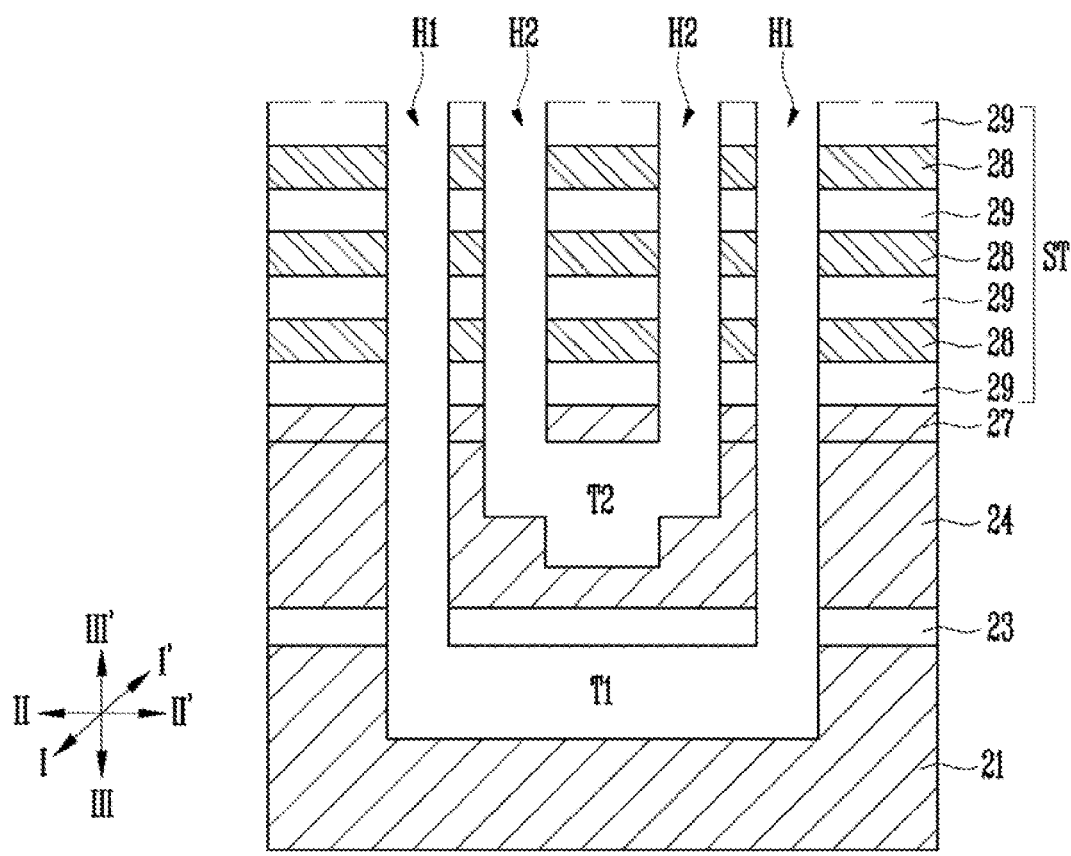

SEMICONDUCTOR DEVICE INCLUDING A PIPE CHANNEL LAYER HAVING A PROTRUDING PORTION

CROSS-REFERENCE TO RELATED APPLICATION

The present application claims priority under 35 U.S.C. 119(a) to Korean patent application number 10-2016-0020751 filed on Feb. 22, 2016, which is incorporated herein by reference in its entirety.

BACKGROUND

1. Field

Various embodiments of the present invention relate generally to an electronic device and, more particularly, to a three-dimensional semiconductor device and a method of manufacturing the same.

2. Description of the Related Art

A non-volatile memory device is a memory device in which stored data is maintained even when the power supply to the device is turned off. Recently, improvement of the degree of integration of a two-dimensional (2D) memory device, in which memory cells are formed in a single layer on a silicon substrate, has reached a limit so that a three-dimensional (3D) non-volatile memory device, in which a plurality of memory cells are vertically stacked on a substrate, has been suggested.

The 3D non-volatile memory device includes interlayer insulating layers and gate electrodes, which are alternately stacked, channel layers passing through the interlayer insulating layers and the gate electrodes, and memory cells stacked along the channel layers. Various structures and manufacturing methods have been developed in order to improve an operation reliability of the non-volatile memory device having a 3D structure. However, further improvements are needed.

SUMMARY OF THE INVENTION

Various embodiments of the present invention are directed to a 3D non-volatile semiconductor device having more stable structure, enhanced performance characteristics, and which can be manufactured using a simpler manufacturing process. Various other embodiments of the present invention are directed to a method of manufacturing of the semiconductor device.

An embodiment of the present invention provides a semiconductor device, including: a first pipe gate; a second pipe gate on the first pipe gate; a stacked structure on the second pipe gate; a first channel layer including a first pipe channel layer positioned within the first pipe gate and first cell channel layers connected to the first pipe channel layer; a second channel layer including a second pipe channel layer positioned within the second pipe gate, and second cell channel layers connected to the second pipe channel layer; and a slit insulating layer passing through the stacked structure and positioned between the adjacent second cell channel layers, wherein the second pipe channel layer has a body portion and a protrusion portion extending below the body portion at a position below the slit insulating layer.

Another embodiment of the present invention provides a semiconductor device, including: a pipe gate; source side gate electrodes stacked on the pipe gate; drain side gate electrodes stacked on the pipe gate; a pipe channel layer positioned within the pipe gate and including a protruding portion on a lower surface of the pipe channel layer; a source side channel layer connected with the pipe channel layer and passing through the source side gate electrodes; and a drain side channel layer connected with the pipe channel layer and passing through the drain side gate electrodes.

Yet another embodiment of the present invention provides a method of manufacturing a semiconductor device, including: forming a first pipe gate including a first trench; forming a second pipe gate which is formed on the first pipe gate, the second pipe gate including a second trench including a protruding portion on a lower surface of the second trench; forming a stacked structure on the second pipe gate; and forming a slit passing through the stacked structure.

The pipe channel layer includes the protruding portion on the lower surface thereof, so that even though the slit is extended up to the pipe channel layer, it is possible to prevent the slit from completely passing through the pipe channel layer. Accordingly, it is possible to prevent the pipe channel from being disconnected and the source side channel layer and the drain side channel layer from being disconnected.

BRIEF DESCRIPTION OF THE DRAWINGS

Various embodiments of the present invention will now be described more fully hereinafter with reference to the accompanying drawings in which, FIGS. 1A and 1B are layout views for describing a structure of a semiconductor device according to an embodiment of the present invention.

FIGS. 5A to 5H are cross-sectional views for describing a method of manufacturing the semiconductor device according to the embodiment of the present invention.

DETAILED DESCRIPTION OF THE INVENTION

Figure 2A:
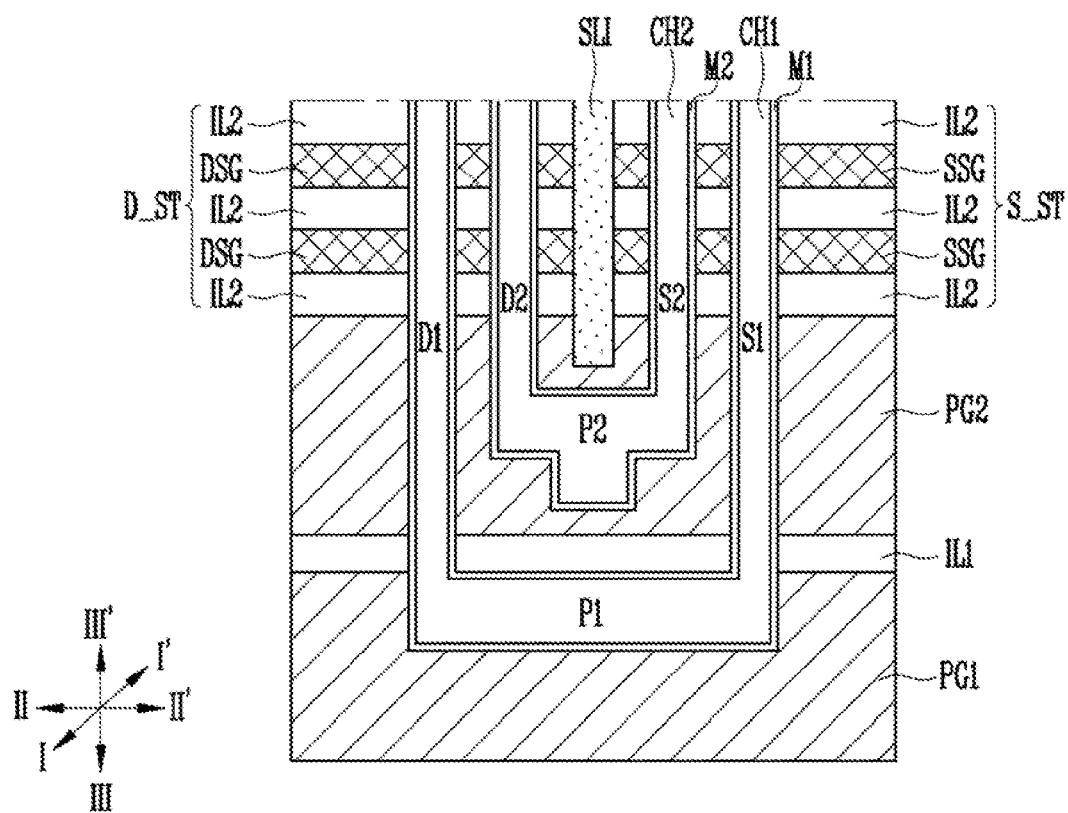
FIGS. 2A, 3A and 4A are cross-sectional views for describing the structure of the semiconductor device according to the embodiment of the present invention

Hereinafter, various embodiments of the present invention will be described. However, it is noted that the present invention may be embodied in different other embodiments and variations thereof and should not be construed as being limited to the embodiments set forth herein. Rather, these embodiments are provided so that the disclosure of the present invention will be thorough and complete.

In the drawings, the thicknesses and the intervals of elements are exaggerated for convenience of illustration, and may be exaggerated compared to an actual physical thickness.

In describing the present invention, well-known features peripheral to the principal point of the present invention may be omitted. It should also be noted that in giving reference numerals to elements of each drawing, like reference numerals refer to like elements even though like elements are shown in different drawings.

It will be understood that when an element is referred to as being "between" two elements, it can be the only element between the two elements, or one or more intervening elements may also be present.

It will be further understood that, although the terms "first", "second", "third", and so on may be used herein to describe various elements, these elements are not limited by these terms. These terms are used to distinguish one element from another element. Thus a first element described below could also be termed as a second or third element without departing from the spirit and scope of the present invention.

The terminology used herein is for the purpose of describing particular embodiments only and is not intended to be limiting of the present invention.

As used herein, singular forms are intended to include the plural forms as well, unless the context clearly indicates otherwise.

It will be further understood that the terms "comprises", "comprising", "includes", and "including" when used in this specification, specify the presence of the stated elements and do not preclude the presence or addition of one or more other elements.

As used herein, the term "and/or" includes any and all combinations of one or more of the associated listed items.

In the following description, numerous specific details are set forth in order to provide a thorough understanding of the present invention. The present invention may be practiced without some or all of these specific details. In other instances, well-known structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, the various embodiments of the present invention will be described in detail with reference to the attached drawings.

Referring now to FIGS. 1A and 1B, a semiconductor device according to an embodiment of the present invention may include first and second channel layers CH1 and CH2. As illustrated in. FIG. 1A, the first channel layers CH1 may be arranged in a first direction I-I' and spaced apart from each other by a preset distance along a second direction II-II'. The second channel layers CH2 may also be arranged in a first direction I-I' and spaced apart from each other by a preset distance in the second direction II-II'. The first and second channel layers CH1 and CH2 may be arranged in an alternating manner along the second direction II-II'.

The first and second channel layers CH1 and CH2 may be elongated members with the first channel layers CH1 having a longer length than the second channel layers CH2 (L1>L2) in the first direction I-I'. Each second channel layer CH2 may be positioned in the interspace between two consecutive first channel layers CH1 and may partially overlap the two consecutive channel layers CH1. Thus as illustrated in FIG. 1A, the second channel layers CH2 may be arranged between the first channel layers CH1 and the first channel layers CH1 and the second channel layers CH2 may partially overlap. In a variation, illustrated in FIG. 1B, the second channel layers CH2 and the first channel layers CH1 are arranged along the second direction II-II' to completely overlap each other. (see FIG. 1B).

Each of the first channel layers CH1 may include a first pipe channel layer P1 and first cell channel layers CH1 connected to the first pipe channel layer P1. Each of the second channel layers CH2 may include a second pipe channel layer P2 and second cell channel layers CH2 connected to the second pipe channel layer P2. Here, the first and second pipe channel layers P1 and P2 may be channel layers for pipe transistors. The first and second cell channel layers may be channel layers for stacked memory cells. For example, each of the first channel layers CH1 may include a first pipe channel layer P1, a first source side channel layer S1 and a first drain side channel layer D1. Further, each of the second channel layers CH2 may include the second pipe channel P2, a second source side channel S2, and a second drain side channel D2.

The first source side channel layer S1 and the first drain side channel layer D1 may protrude from an upper surface of the first pipe channel layer P1 as illustrated in FIG. 2A. Likewise, the second source side channel layer S2 and the second drain, side channel layer D2 may protrude from an upper surface of the second pipe channel layer P2 as illustrated in FIG. 2A. Accordingly, each of the first and second channel layers CH1 and CH2 may have a "U" shape when viewed from the side as in FIG. 2A for example.

The first drain side channel layer D1, the second drain side channel layer D2, the second source side channel layer S2, and the first source side channel layer S1 may be sequentially arranged in a first direction I-I' in the recited order as illustrated in FIG. 1A, with the first drain side channel layer D1 and the first source side channel layer S1 being aligned along a first line extending in the II' direction while the second drain side channel layer D2 and the second source side channel layer S2 being aligned along a second line extending in the II' direction. The first and second lines are substantially parallel. In addition, the second pipe channel P2 is shorter than the first pipe channel P1. In the embodiment of FIG. 1B, the first drain side channel layer D1, the second drain side channel layer D2, the second source side channel layer S2 and the first source side channel layer S1 are arranged in series in a line extending along the I-I' direction.

A slit insulating layer SLI may be positioned between the second drain side channel layer D2 and the second source side channel layer S2 adjacent to each other in the first direction I-I', and may be extended in the second direction II-II'.

Although the present embodiment describes the semiconductor device including the first channel layer CH1 and the second channel layer CH2 vertically stacked on each other, the semiconductor device may include only the second channel layer CH2 including a protrusion, without the first channel layer CH1.

Referring to FIGS. 2A to 4A, the semiconductor device may include a first pipe gate PG1 and a second pipe gate PG2 sequentially stacked on each other in a third direction III-III' which is substantially vertical to the plane of the first and second directions I-I' and II-II'. The first pipe gate PG1 and the second pipe gate PG2 may be or include a conductive material such as polysilicon, or tungsten. A first insulating layer IL1 may be interposed between the first pipe gate PG1 and the second pipe gate PG2. The first pipe gate PG1 and the second pipe gate PG2 may be mutually insulated from each other by the first insulating layer IL1. The insulating layer IL1 may include any suitable insulating material such as, for example, silicon oxide.

A source side stacked structure S_ST and a drain side stacked structure D_ST may be positioned on the second pipe gate PG2. For example, the source side stacked structures S_ST and the drain side stacked structures D_ST may be alternately arranged. More specifically, the source side stacked structure S_ST may include source side gate electrodes SSG and second insulating layers IL2 alternately stacked along the third direction III-III'. The drain side stacked structure D_ST may include drain side gate electrodes DSG and the second insulating layers IL2 alternately stacked along the third direction III-III'.

Further, the slit insulating layer SLI may be positioned between the source side stacked structure S_ST and the drain side stacked structure D_ST and extend in the third direction III-III' to separate two adjacent source and drain side stacked structures S_ST and D_ST. Accordingly, the source side gate electrode SSG and the drain side gate electrode DSG positioned at the same level may be insulated from each other by the slit insulating layer SLI. The slit insulating layer SLI may extend inside the second pipe gate layer PG2 at its lower end. The upper end of the slit insulating layer may be at the same level in the III-III' direction as the top surface of the uppermost second insulating layer IL2. The slit insulating layer may be or include any suitable insulating material.

The first channel layer CH1 may include the first pipe channel P1, the first source side channel S1, and the first drain side channel D1, and have a "U" shape. The second channel layer CH2 may include the second pipe channel P2, the second source side channel S2, and the second drain side channel D2, and may have a smaller "U" shape when viewed from the side.

The first pipe channel layer P1 may be positioned within the first pipe gate PG1. The first source side channel layer S1 may pass through the first insulating layer IL1, the second pipe gate PG2, and the source side stacked structure S_ST. The first drain side channel layer D1 may pass through the first insulating layer IL1, the second pipe gate PG2, and the drain side stacked structure D_ST. The second pipe channel layer P2 may be positioned within the second pipe gate PG2. The second source side channel layer S2 may pass through the second pipe gate PG2 and the source side stacked structure S_ST. The second drain side channel layer D2 may pass through the second pipe gate PG2 and the drain side stacked structure D_ST.

The first and second source side channel layers S1 and S2 of the first and second channel layers CH1 and CH2 may pass through one source side stacked structure S_ST. In addition, the first and second drain side channel layers D1 and D2 of the first and second channel layers CH1 and CH2 may pass through one drain side stacked structure D_ST.

The semiconductor device may further include a first memory layer M1 surrounding the first channel layer CH1 and a second memory layer M2 surrounding the second channel layer CH2. Each of the first and second memory layers M1 and M2 may include a tunnel insulating layer, a data storing layer, and a charge blocking layer which are well known in the art and are thus are not shown. Any suitable materials may be used for these layers. For example, the data storing layer may include a floating gate, such as polysilicon, a charge trap material, such, as a nitride, a phase change material, a nano dot, and the like.

Further, each of the first and second channel layers CH1 and CH2 may have a structure, in which a core region thereof is completely filled, or a structure, in which a core region thereof is opened. A gap-fill insulating layer GI may be filled in the opened core region. For reference, for convenience of the description, the gap-fill insulating layer GI is not illustrated in FIGS. 2A, 3A, and 4A, but as illustrated in FIGS. 3B and 4B, the first and second channel layers CH1 and CH2 may include the gap-fill insulating layers GI.

Figure 2B:
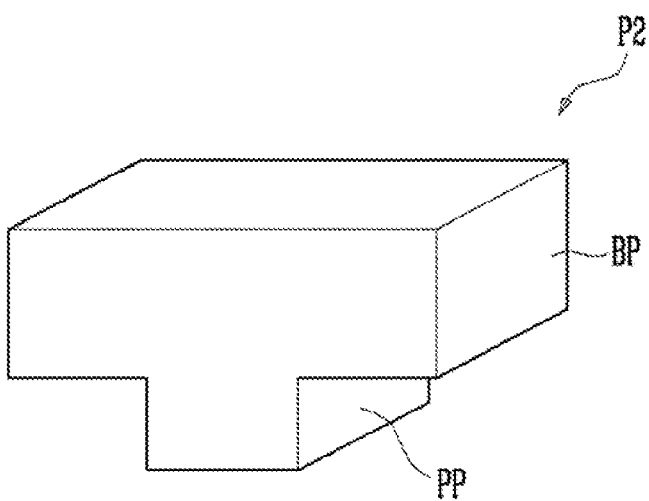
FIGS. 2B, 3B and 4B are perspective views for describing a structure of a pipe channel layer according to the embodiment of the present invention.

Referring to FIGS. 2A and 2B the second pipe channel layer P2 may include a body portion BP and a protruding portion PP protruded from a lower surface of the body portion BP to define a "T" shaped cross-section. Further, the slit insulating layer SLI may partially pass through the second pipe gate PG2. Accordingly, the second pipe gate PG2 may include a recess formed on an upper surface thereof, and the slit insulating layer SLI may be filled in the recess.

Figure 3A:
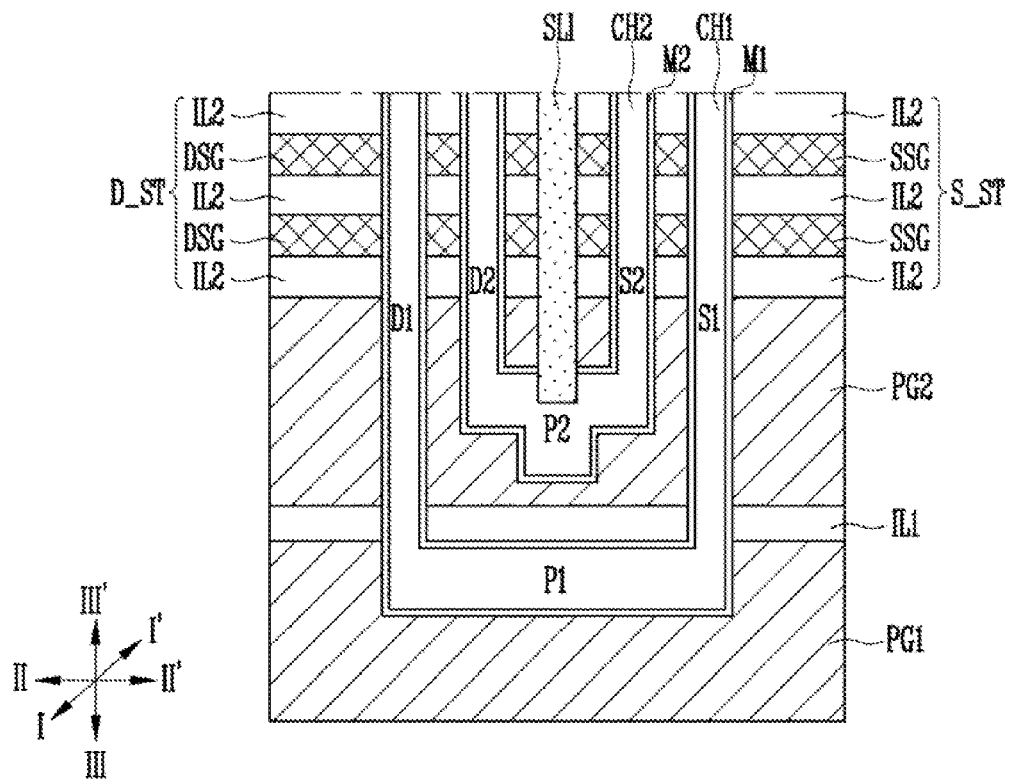
Figure 3B:
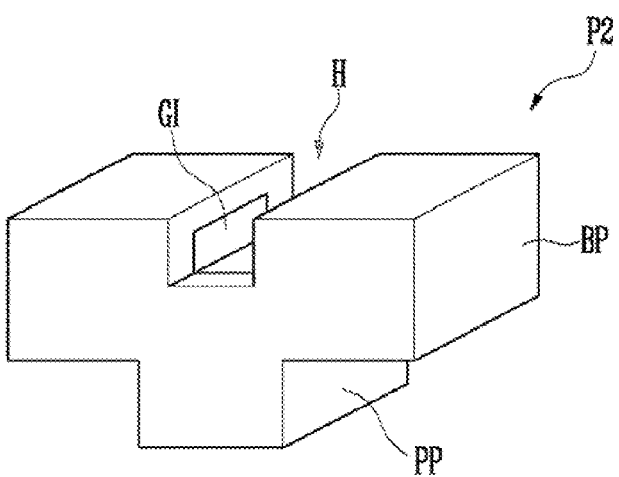

In a different embodiment, illustrated in FIGS. 3A and 3B, the slit insulating layer SLI may enter into a part of the body portion BP of the second pipe channel layer P2 to form a recess H on an upper surface of the second pipe channel layer P2. As illustrated in FIG. 3B, the gap-fill insulating layer GI within the second pipe channel layer P2 may be exposed through the recess H. The slit insulating layer SLI may be filled in the recess H.

Figure 4A:
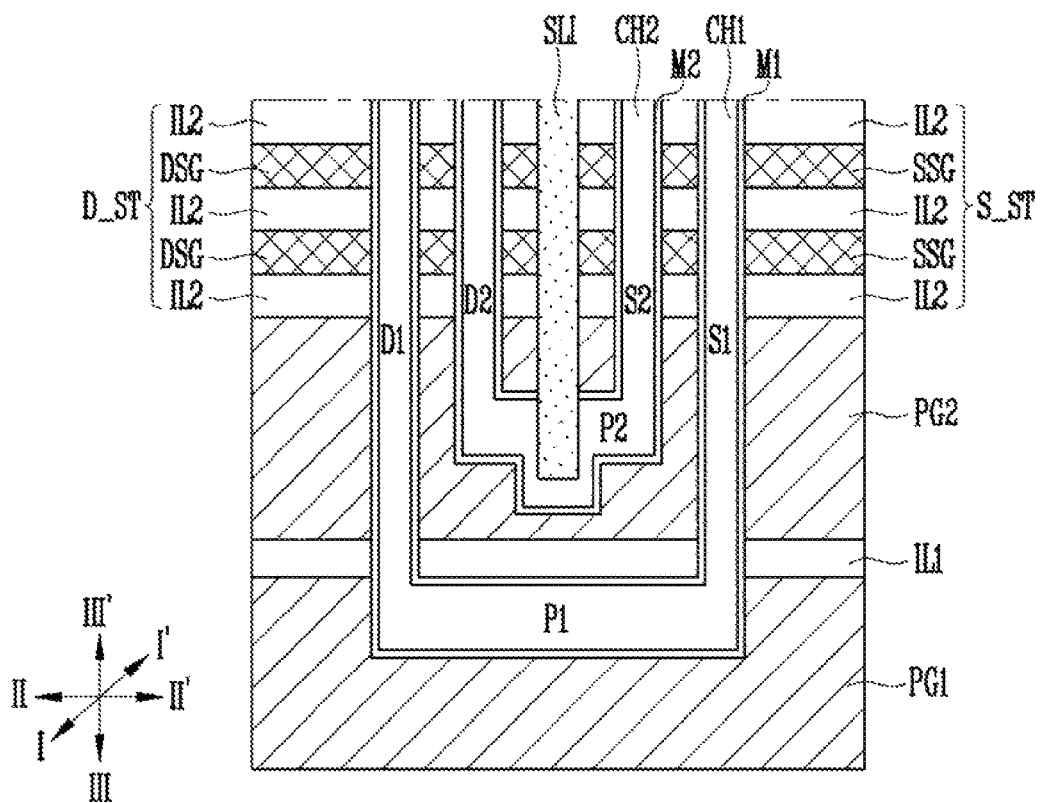
Figure 4B:
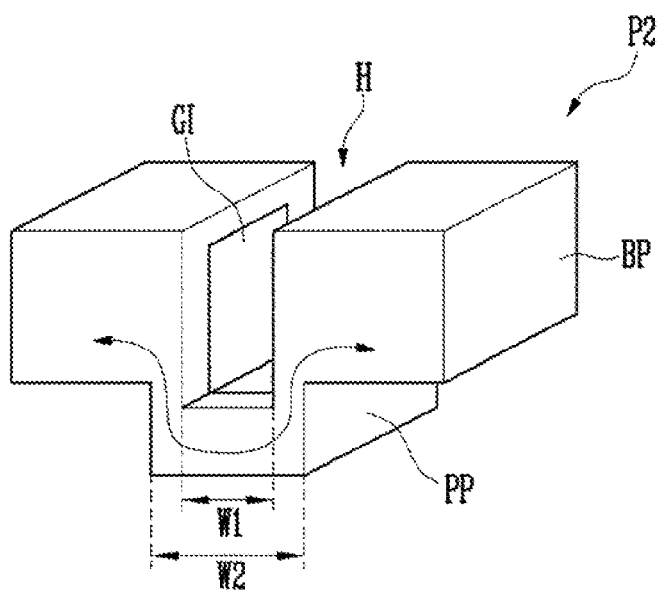

Referring to FIGS. 4A and 4B, the slit insulating layer SLI may completely pass through the body portion BP of the second pipe channel layer P2, and then enter into a small upper region of the protruding portion PP of the "T" shaped second pipe channel layer P2. In this case, the recess H may be formed on the upper surface of the second pipe channel layer P2, and the slit insulating layer SLI may be filled in the recess H.

If the second pipe channel layer P2 does not include the protruding portion PP, it is possible for the slit insulating layer SLI to completely pass through the second pipe channel layer P2, so that the second source side channel layer S2 and the second drain side channel layer D2 are not be connected to each other. On the other hand, according to the aforementioned structure, since the slit insulating layer SLI may protrude downward from the source side stacked structure S_ST and the drain side stacked structure D_ST to extend up to the second pipe channel layer P2, it is possible to secure a safe margin by the protruding portion PP during manufacturing to prevent the second pipe channel layer P2 from being cut in half thus disconnecting the second source side channel layer S2 from the second drain side channel layer D2. For example, the protruding portion PP may have a larger width (W2>W1) than the slit insulating layer SLI, so that even though the slit insulating layer SLI is extended up to the protruding portion PP, a connection state may be maintained.

FIGS. 5A to 5H are cross-sectional views for describing a method of manufacturing the semiconductor device according to an embodiment of the present invention.

Figure 5A:
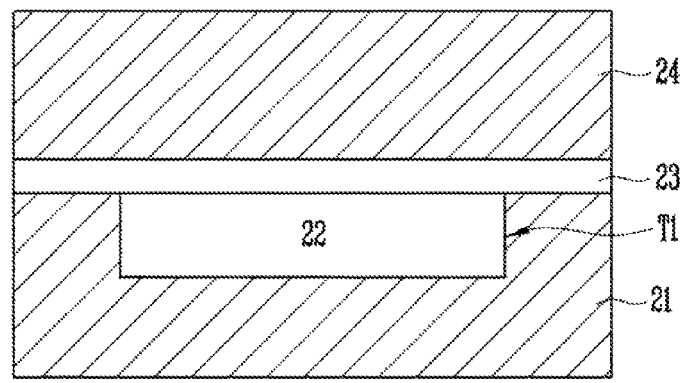

Referring to FIG. 5A, a first trench T1 may be formed within the first pipe gate 21, and then a first sacrificial layer 22 may be formed within the first trench T1. Here, the first pipe gate 21 may include a conductive material, such as polysilicon, or tungsten. The first sacrificial layer 22 may include a material having a higher etch selectivity with respect to the first pipe gate 21, and may include, for example, a titanium nitride (TiN). The first trench T1 provides a space for forming the first pipe channel layer P1. The first trench T1 may have a quadrangular cross-section. For example, the first trench may have a rectangular or a trapezoidal cross-section.

Next, an insulating layer 23 and a second pipe gate 24 may be sequentially formed on the first pipe gate 21. Here, the insulating layer 23 may be or include a suitable insulating material. For example, the insulating layer 23 may be or include an oxide, such as for example, a silicon oxide. The second pipe gate 24 may be or include a conductive material, such as, for example, polysilicon, or tungsten.

Figure 5B:
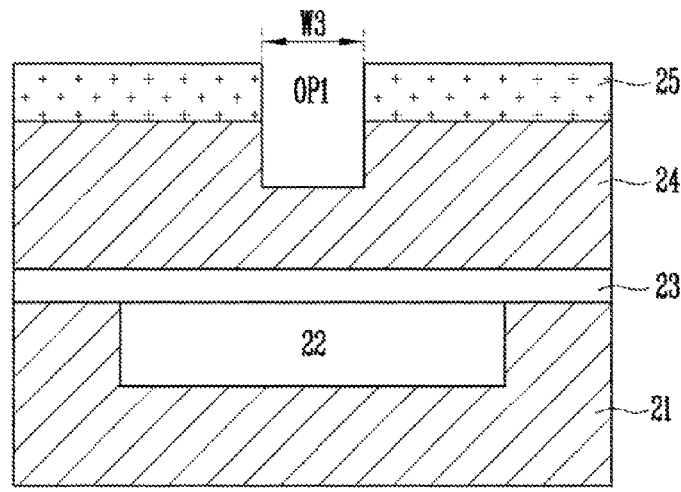

Referring to FIG. 5B, a first mask pattern 25 including a first opening OP1 having a first width W3 may be formed on the second pipe gate 24. Subsequently, the second pipe gate 24 may be first partially etched using the first mask pattern 25 as a barrier to extend the first opening OP1 inside the second pipe gate 24.

Figure 5C:
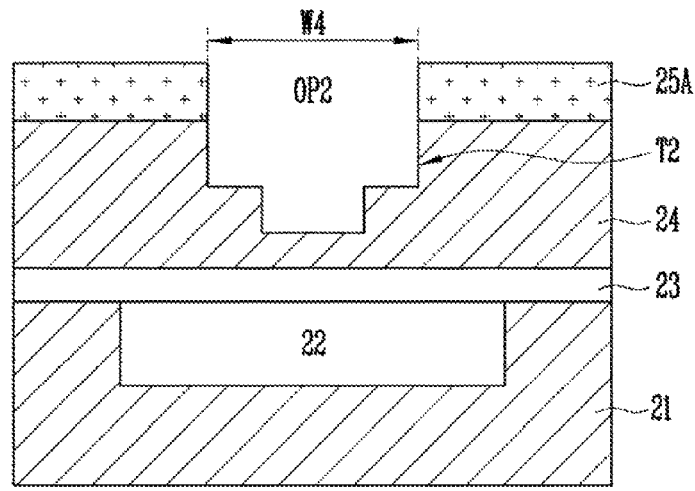

Referring to FIG. 5C, the first opening GP having the first width W3 may be expanded to a second opening OP2 having a second width W4 by shrinking the first mask pattern 25. For example, the first opening OP1 may be expanded to the second opening OP2 by isotropically etching the first mask pattern 25.

Next, a second trench T2 may be formed by secondarily partially etching the second pipe gate 24 using the shrunk first mask pattern 25A as a barrier. In this case, the etching process may be performed in a state where the trench formed by the first etching is exposed through the second opening OP2, so that the second trench T2 including a protruding portion on a lower surface thereof may be formed. The second trench T2 may have a T shaped cross-section.

Figure 5D:
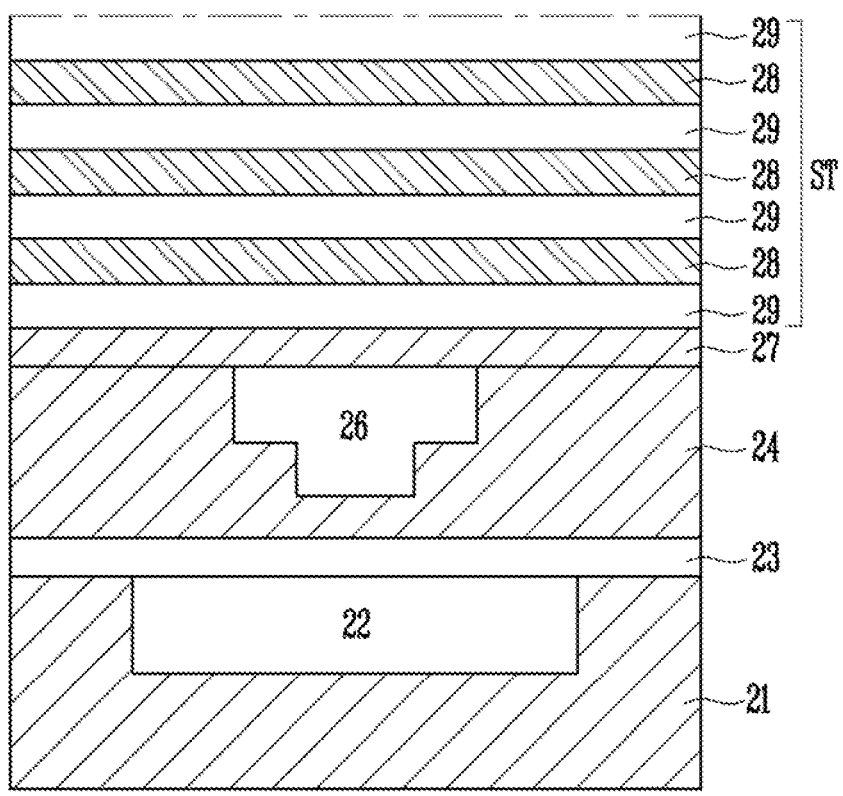

Referring to FIG. 5D, a second sacrificial layer 26 may be formed within the second trench T2. The second sacrificial layer 26 may include a material having a higher etch selectivity with respect to the second pipe gate 24, and may include, for example, a titanium nitride (TiN). Next, a capping layer 27 may be formed on the second pipe gate 24. The capping layer 27 may be or include a conductive material, such as, for example, polysilicon, or tungsten, and may be electrically connected with the second pipe gate 24. Accordingly, the capping layer 27 may be used as an etch stop layer during a subsequent slit forming process, and may be used as a part of the second pipe gate 24.

Next a stacked structure ST may be formed on the capping layer 27. The stacked structure ST may include first material layers 28 and second material layers 29 alternately stacked on each other. Here, the first material layers 28 may be used for forming a gate electrode of a memory cell or a select transistor. The second material layers 29 may be used for insulating the stacked gate electrodes from each other. For example, the first material layers 28 may be or include a sacrificial material, such as a nitride, and the second material layers 29 may be or include an insulating material, such as an oxide. In another example, the first material layers 28 may include a conductive material, such as polysilicon, tungsten, and the like, and the second material layers 29 may include an insulating material such as an oxide and the like. In yet another example, the first material layers 28 may include a conductive material, such as doped polysilicon and the like, and the second material layers 29 may include a sacrificial material, such as undoped polysilicon and the like. In the illustrated embodiment, case in which the first material layers 28 are sacrificial layers and the second material layers are insulation layers will be described.

Referring to FIG. 5E, first holes H1 may be formed which are passing through the stacked structure ST, the capping layer 27 and the second pipe gate 24 and are connected with the first trench T1. Also second holes H2 may be formed which are passing through the stacked structure ST, the capping layer 27 and are connected with the second trench T2. The first and second holes H1 and H2 may have a circular, elliptical, quadrangular, or polygonal cross-section. The first and second holes H1 and H2 may have a constant area cross-section along their, entire length as illustrated in FIG. 5E. However, the first and second holes H1 and H2 may also have a variable area cross-section along their length in the third III-III' direction. For example, the first and second holes H1 and H2 may have inclined sidewalls with a lowermost cross-section at the point where the holes H1 and H2 join their respective trenches T1 and T2 having an area that is different from the area of the uppermost cross-section of the holes H1 and H2.

Next, the first sacrificial layer 22 may be removed through the first holes H1 and the second sacrificial layer 26 may be removed through the second holes H2.

Accordingly, openings which have a U-shape and are vertically positioned may be formed.

Figure 5F:
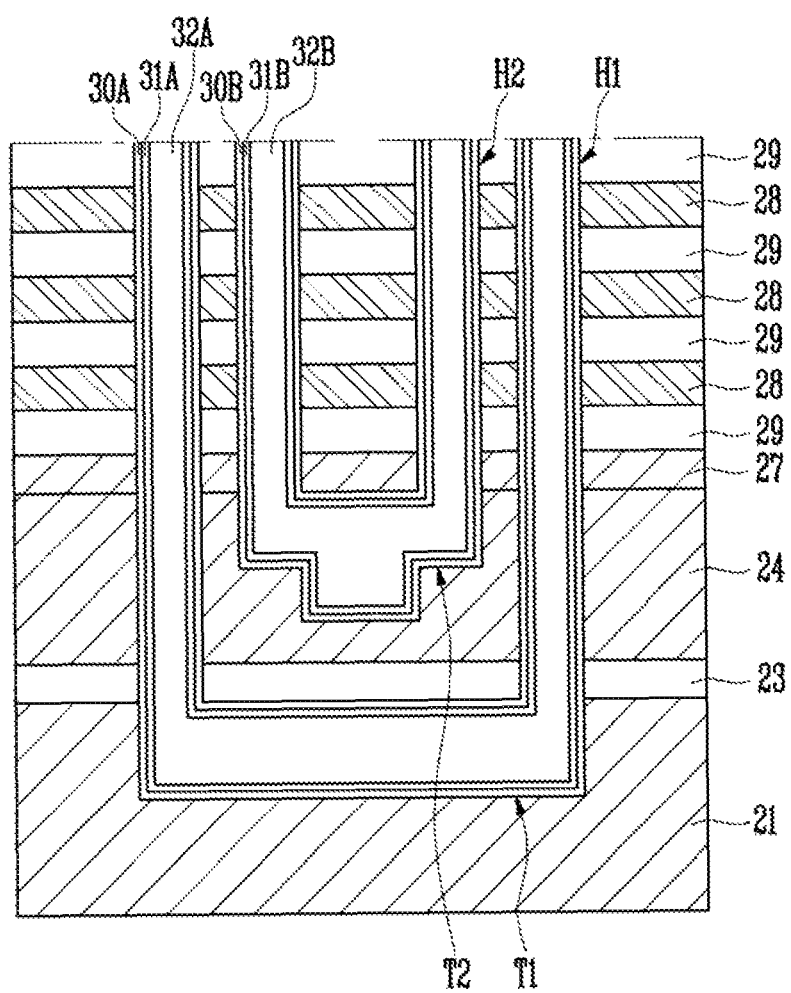

Referring to FIG. 5F, a first memory layer 30A, a first channel layer 31A, and a first gap-fill insulating layer 32A may be formed within the first trench T1 and the first holes H1. Further, a second memory layer 30B, a second channel layer 31B and a second gap-fill insulating layer 32B may be formed within the second trench T2 and the second holes H2. Here, the second memory layer 30B, the second channel layer 31B, and the second gap-fill insulating layer 32B may be formed along an inner surface of the second trench T2, so that the second channel layer 31B may include a protruding portion on a lower surface thereof.

Figure 5G:
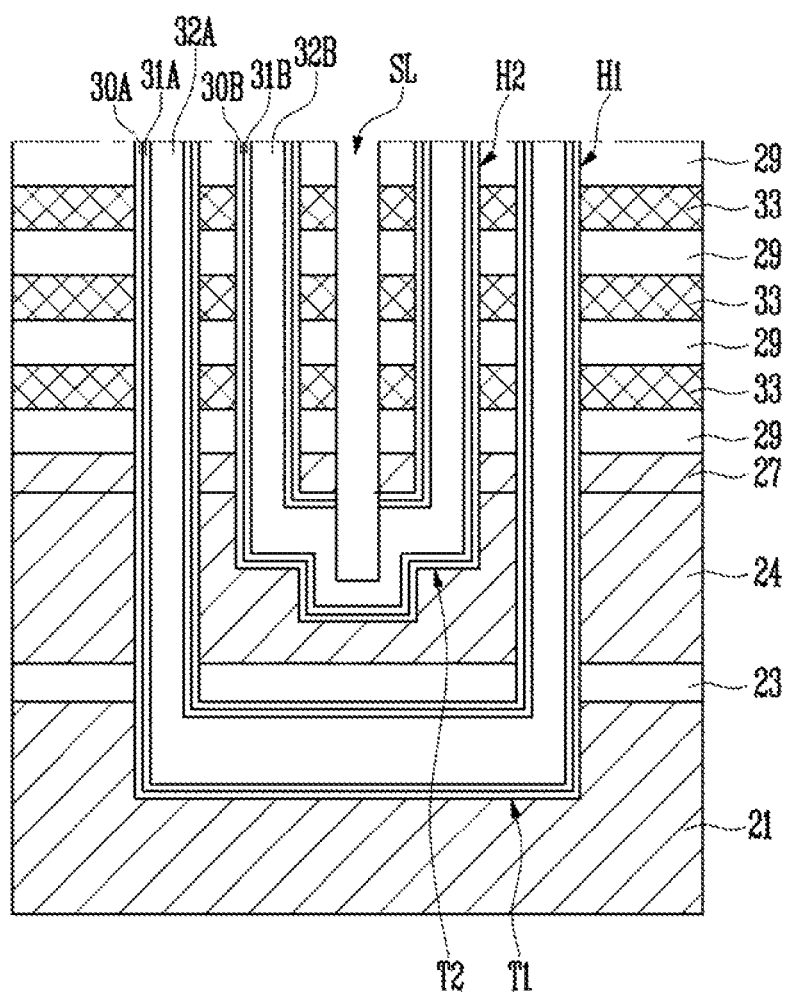

Referring to FIG. 5G, a slit SL passing through the stacked structure ST may be formed. The slit SL may be positioned between the adjacent second holes H2. Further, the slit SL may be extended to an upper region of the protruding portion of the second trench T2 so that the slit SL and the protruding portion may partially overlap in a stack direction. Accordingly, even though the slit SL is extended up to the second trench T2 by over-etching, it is still possible to prevent the slit SL from completely passing through, the second trench T2 and cutting in two halves. That is, it is possible to prevent the second channel layer 31B from being cut and being separated into left and right sides of the slit SL.

Figure 5H:
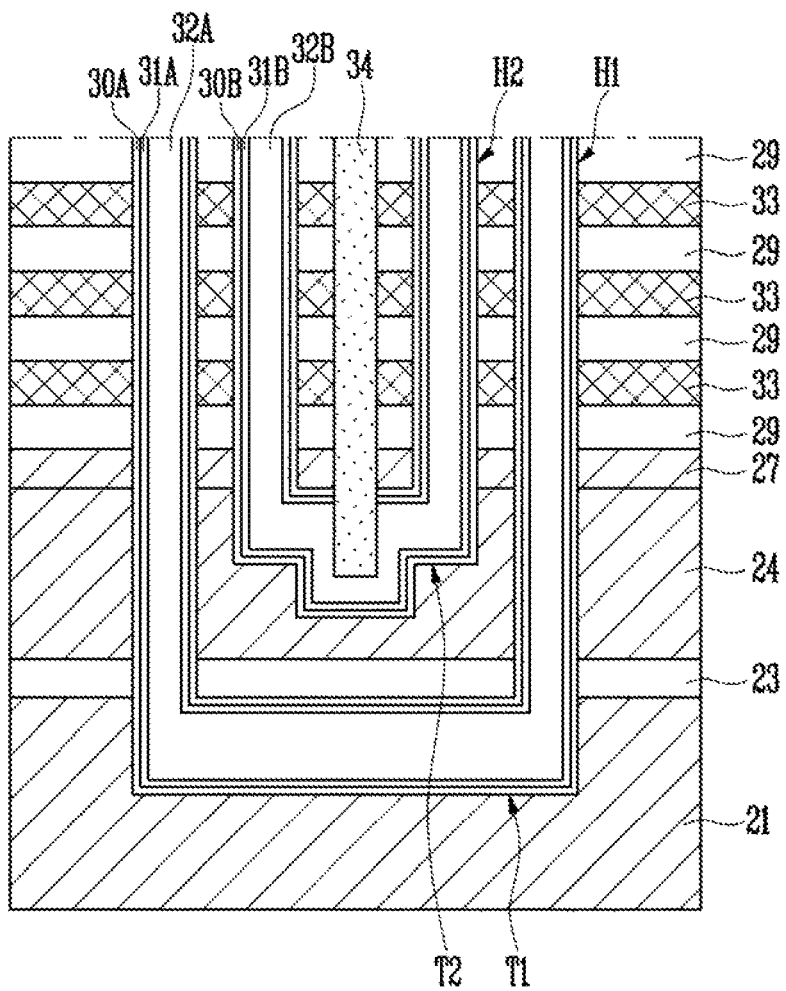

Referring to FIG. 5H, after the first material layers 28 are removed through the slit SL, conductive layers 33 may be formed where the first material layers 28 are removed. The conductive layers 33 may be or include, for example, polysilicon, tungsten, and the like. Here, the conductive layers 33 may form a gate electrode of the memory cell or the select transistor. Next, a slit insulating layer 34 may be formed within the slit SL.

In the meantime, a process after the forming of the slit SL may be changed according to the properties of the first and second material layers 28 and 29. For example, when the first material layers 28 are conductive layers and the second material layers 29 are insulating layers, the first material layers 28 exposed through the slit SL may be silicided and then the slit insulating layer 34 may be formed. Further, when the first material layers 28 are conductive layers and the second material layers 29 are sacrificial layers, the second material layers 29 may be replaced with insulating layers through the slit SL.

Figure 6:
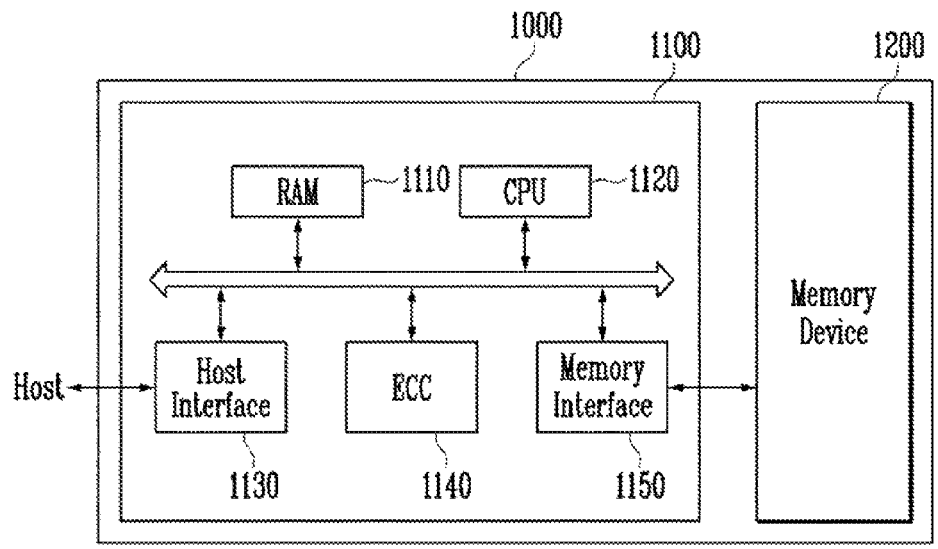
FIGS. 6 and 7 are block diagrams illustrating a configuration of a memory system according to an embodiment of the present invention.

Referring to FIG. 6, a memory system 1000 according to an embodiment of the present invention may include a memory device 1200 and a controller 1100.

The memory device 1200 may be used for storing data information having various data forms, such as text, graphic, and software codes. The memory device 1200 may be a non-volatile memory, and may include the structure described above with reference to FIGS. 1A to 5H. Further, the memory device 1200 may include: a first pipe gate; a second pipe gate on the first pipe gate a stacked structure on the second pipe gate; a first channel layer including a first pipe channel layer within the first pipe gate and first cell channel layers passing through the stacked structure and connected to the first pipe channel layer; a second channel layer including a second pipe channel layer positioned within the second pipe gate and having a protruding portion on a lower surface thereof, and second cell channel layers passing through the stacked structure and connected to the second pipe channel layer; and a slit insulating layer passing through the stacked structure and positioned between the adjacent first cell channel layers. A structure and the manufacturing method of the memory device 1200 may be the same as those described above. Accordingly, detailed descriptions thereof will be omitted.

The controller 1100 may be connected to a host and the memory device 1200. The controller 1100 may access the memory device 1200 in response to a request from the host. For example, the controller 1100 may control read, write, erase, and background operations of the memory device 1200.

The controller 1100 may include a Random Access Memory (RAM) 1100, a Central Processing Unit (CPU) 1120, a host interface 1130, an Error Correction Code (ECC) circuit 1140, a memory interface 1150, and the like.

Here, the RAM 1110 may be used as an operation memory of the CPU 1120, a cache memory between the memory device 1200 and the host, a buffer memory between the memory device 1200 and the host, and the like. For example, the RAM 1100 may be replaced with a Static Random Access Memory (SRAM), Read Only Memory (ROM), and the like.

The CPU 1120 may control a general operation of the controller 1100. For example, the CPU 1120 may operate firmware, such as a Flash Translation Layer (FTL), stored in the RAM 1110.

The host interface 1130 may perform interfacing with the host. For example, the controller 1100 may communicate with the host through at least one of various interface protocols, such as a Universal Serial Bus (USB) protocol, a Multimedia Card (MMC) protocol, a Peripheral Component Interconnection (PCI) protocol, a PCI-express (PCI-E) protocol, an Advanced Technology Attachment (ATA) protocol, a Serial-ATA protocol, a Parallel-ATA protocol, a Small Computer Small Interface (SCSI) protocol, an Enhanced Small Disk Interface (ESDI) protocol, an Integrated Drive Electronics (IDE) protocol, and a private protocol.

The ECC circuit 1140 may detect and correct an error included in data read from the memory device 1200 by using an ECC.

The memory interface 1150 may perform interfacing with the memory device 1200. For example, the memory interface 1150 may include a NAND interface or a NOR interface.

For example, the controller 1100 may further include a buffer memory (not illustrated) for temporarily storing data. Here, the buffer memory may be used for temporarily storing data transmitted to an external device through the interface 1130, or temporarily storing data transmitted from the memory device 1200 through the memory interface 1150. Further, the controller 1100 may further include an ROM storing code data for interfacing with the host.

As described above, the memory system 1000 according to an embodiment of the present invention may include the memory device 1200 having a more stable structure and enhanced characteristics, thereby also improving a characteristics of the memory system 1000.

Figure 7:
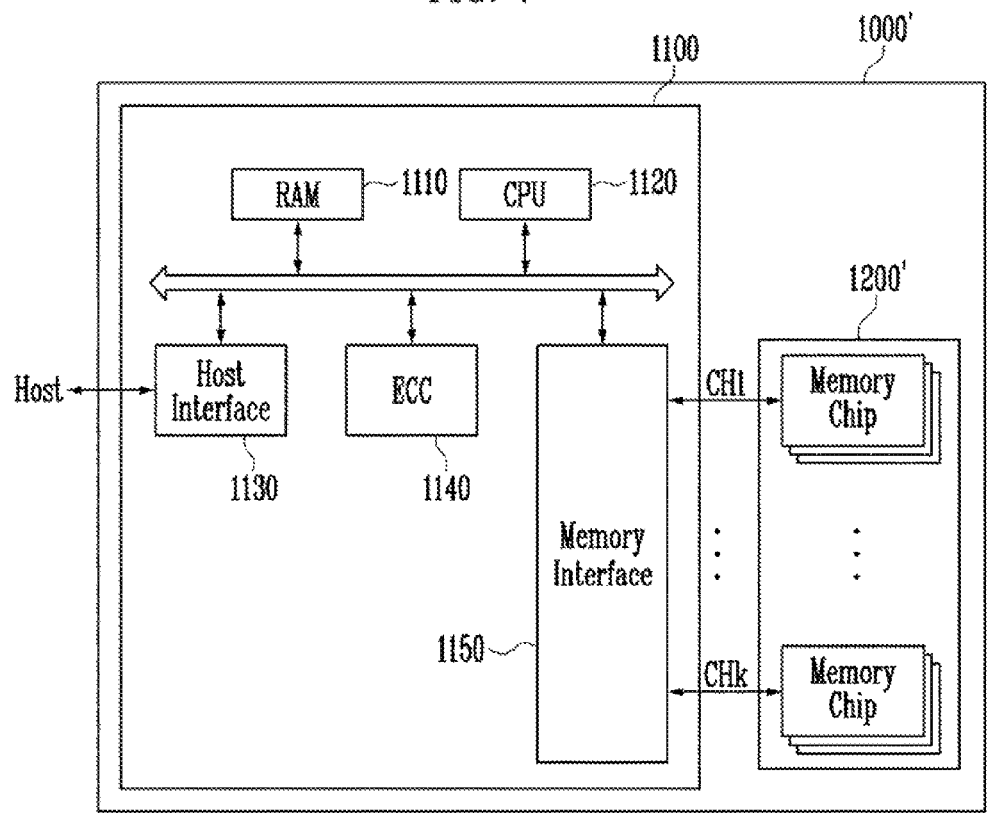

As illustrated in FIG. 7, a memory system 1000' according to an embodiment of the present invention may include a memory device 1200' and a controller 1100. Further, the controller 1100 may include a RAM 1110, a CPU 1120, a host interface 1130, an ECC circuit 1140, a memory interface 1150, and the like. Hereinafter, contents overlapping the aforementioned description will be omitted.

The memory device 1200' may be a 3D non-volatile memory, and may include a memory string as described above with reference to FIGS. 1A to 5H. Further, the memory device 1200' may include: a first pipe gate; a second pipe gate on the first pipe gate; a stacked structure on the second pipe gate; a first channel layer including a first pipe channel layer within the first pipe gate and first cell channel layers passing through the stacked structure and connected to the first pipe channel layer; a second channel layer including a second pipe channel layer positioned within the second pipe gate and having a protruding portion on a lower surface thereof, and second cell channel layers passing through the stacked structure and connected to the second pipe channel layer; and a slit insulating layer passing through the stacked structure and positioned between the adjacent first cell channel layers. A structure and the manufacturing method of the memory device 1200' may be the same as those described above. Accordingly, detailed descriptions thereof will be omitted.

Further, the memory device 1200' may be a multi-chip package formed of a plurality of memory chips. The plurality of memory chips may be classified into a plurality of groups. The plurality of groups may communicate with the controller 1100 through first to $k^{th}$ channels CH1 to CHk. Further, the memory chips included in one group may be configured to communicate with the controller 1100 through a common channel. For example, the memory system 1000' may be modified so that one memory chip may be connected to one channel.

As described above, the memory system 1000' according to an embodiment of the present invention may include the memory device 1200' having a more stable structure and enhanced characteristics, thereby also improving the characteristics of the memory system 1000'. For example, the memory device 1200' may be formed in a multi-chip package, so that it is possible to increase a data storage capacity of the memory system 1000' and improve a driving speed.

Figure 8:
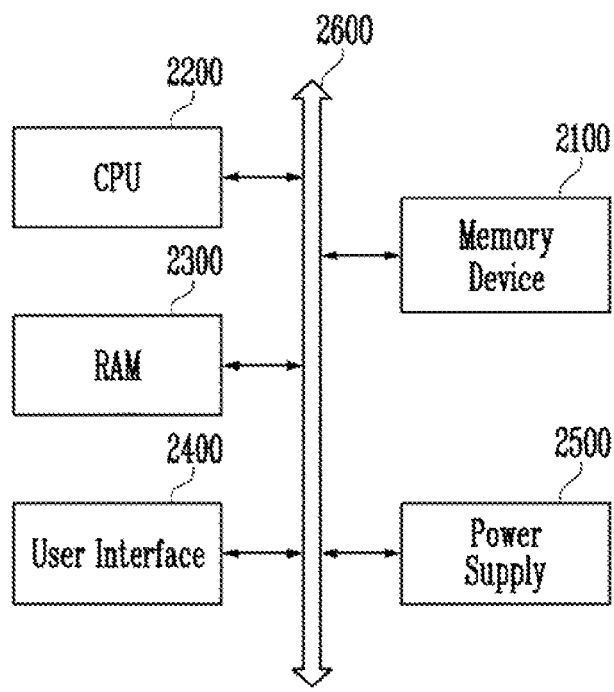
FIGS. 8 and 9 are block diagrams illustrating a computing system according to an embodiment of the present invention.

As illustrated in FIG. 8, a computing system 2000 according to an embodiment of the present invention may include a memory device 2100, a CPU 2200, a RAM 2300, a user interface 2400, a power supply 2500, a system bus 2600, and the like. Hereinafter, contents overlapping the aforementioned description will be omitted.

The memory device 2100 may store data provided through the user interface 2400, data processed by the CPU 2200, and the like. Further, the memory device 2100 may be electrically connected to the CPU 2200, the RAM 2300, the user interface 2400, and the power supply 2500 through the system bus 2600. For example, the memory device 2100 may be connected to the system bus 2600 through a controller (not illustrated), or may be directly connected to the system bus 2600. When the memory device 2100 is directly connected to the system bus 2600, a function of the controller may be performed by the CPU 2200, the RAM 2300, and the like.

Here the memory device 2100 may be a non-volatile memory, and may include a memory string as described above with reference to FIGS. 1A to 5H. Further, the memory device 2100 may include: a first pipe gate; a second pipe gate on the first pipe gate; a stacked structure on the second pipe gate; a first channel layer including a first pipe channel layer within the first pipe gate and first cell channel layers passing through the stacked structure and connected to the first pipe channel layer; a second channel layer including a second pipe channel layer positioned within the second pipe gate and having a protruding portion on a lower surface thereof, and second cell channel layers passing through the stacked structure and connected to the second pipe channel layer; and a slit insulating layer passing through the stacked structure and positioned between the adjacent first cell channel layers. A structure and the manufacturing method of the memory device 2100 may be the same as those described above. Accordingly, detailed descriptions thereof will be omitted.

Further, the memory device 2100 may be a multi-chip package formed of a plurality of memory chips as described above with reference to FIG. 7.

The computing system 2000 including the aforementioned configuration may include a computer, an Ultra Mobile PC (UMPC), a workstation, a net-book computer, personal digital assistants (PDA), a portable computer, a web tablet PC, a wireless phone, a mobile phone, a smart phone, an e-book reader; a portable multimedia player (PMP), a portable game device, a navigation device, a black box, a digital camera, a 3D television, a digital audio recorder, a digital audio player, a digital picture recorder, a digital picture player, a digital video recorder, a digital video player; a device capable transceiving information in a wireless environment, one of various electronic devices configuring a home network, one of various electronic devices configuring a computer network, one of various electronic devices configuring a telematics network, an RFID device, and the like.

As described above, the memory system 2000 according to an embodiment of the present invention may include the memory device 2100 having a stable structure and characteristics, thereby also improving the characteristics of the memory system 2000.

Figure 9:
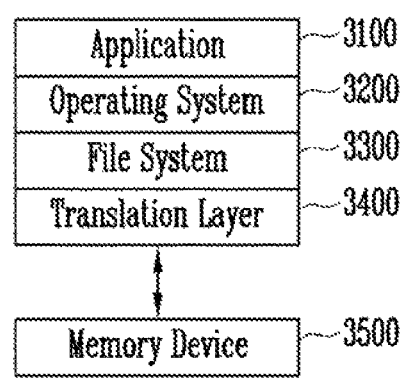

As illustrated in FIG. 9, a computing system 3000 according to an embodiment of the present invention may include a software layer including an operating system 3200, an application 3100, a file system 3300, a translation layer 3400, and the like. Further, the computing system 3000 may include a hardware layer, such as a memory device 3500.

The operating system 3200 may be provided for managing software and hardware sources, and the like of the computing system 3000, and may control an execution of a program of a CPU. The application 3100 may be various application programs executed in the computing system 3000, such as, for example, a utility executed by the operation system 3200.

The file system 3300 may indicate a logical structure for managing data, a file, and the like residing in the computing system 3000, and may organize a file or data to be stored in the memory device 3500 and the like according, to a rule. The file system 3300 may be determined by the operation system 3200 used in the computing system 3000. For example, when the operation system 3200 is a series of Windows of the Microsoft Company, the file system 3300 may be a File Allocation Table (FAT), a NT file system (NTFS), and the like. Further, when the operation system 3200 is a series of Unix/Linux, the file system 3300 may be an Extended File System (EXT), a Unix File System (UFS), a Journaling File System (JFS), and the like.

In the present drawings although the operation system 3200, the application 3100, and the file system 3300 are illustrated as separate blocks, the application 3100 and the file system 3300 may be included in the operation system 3200.

The translation layer 3400 may translate addresses into a form appropriate to the memory device 3500 in response to a request from the file system 3300. For example, the translation layer 3400 may translate logic addresses generated by the file system 300 into physical addresses of the memory device 3500. Here, mapping information of the logic addresses and the physical addresses may be stored in an address translation table. For example, the translation layer 3400 may be a Flash Translation Layer (FTL), a Universal Flash Storage Link Layer (ULL), and the like.

The memory device 3500 may be a 3D non-volatile memory, and may include a memory string as described above with reference to FIGS. 1A to 5H. Further, the memory device 3500 may include: a first pipe gate; a second pipe gate on the first pipe gate, a stacked structure on the second pipe gate; a first channel layer including a first pipe channel layer within the first pipe gate and first cell channel layers passing through the stacked structure and connected to the first pipe channel layer; a second channel layer including a second pipe channel layer positioned within the second pipe gate and having a protruding portion on a lower surface thereof, and second cell channel layers passing through the stacked structure and connected to the second pipe channel layer; and a slit insulating layer passing through the stacked structure and positioned between the adjacent first cell channel layers. A structure and the manufacturing method of the memory device 3500 may be the same as those described above. Accordingly, detailed descriptions thereof will be omitted.

The computing system 3000 including the aforementioned configuration may be divided into an operation system layer performed in a high level region and a controller layer performed in a low level region. Here, the application 3100, the operation system 3200, and the file system 3300 may be included in the operation system layer, and may be driven by an operation memory of the computing system 300. Further, the translation layer 3400 may be included in the operation system layer or the controller layer.

As described above, the memory system 3000 according to the embodiment of the present invention may include the memory device 3500 having a stable structure and characteristics, thereby also improving a characteristics of the memory system 3000.

The present invention has been described according to the described embodiments in sufficient detail. We note that the described embodiments were provided for purposes of illustration and not for limiting the present invention. Hence, those skilled in the art will appreciate that various other embodiments and variations thereof may be made within the technical spirit and scope of the present invention as defined in the appended claims.

For example, although certain materials were disclosed as examples for making the various layers and features of the present invention, it is well understood that the present invention is not limited to the use of the disclosed materials only, and that any other suitable materials may be used.

What is claimed is:

1. A semiconductor device, comprising:
   a first pipe gate;
   a second pipe gate on the first pipe gate;
   a stacked structure on the second pipe gate;
   a first channel layer including a first pipe channel layer positioned within the first pipe gate and first cell channel layers connected to the first pipe channel layer;
   a second channel layer including a second pipe channel layer positioned within the second pipe gate and second cell channel layers connected to the second pipe channel layer; and
   a slit insulating layer passing through the stacked structure and positioned between the adjacent second cell channel layers, wherein the second pipe channel layer has a body portion and a protrusion portion protruded from a lower surface of the second pipe channel layer at a position below the slit insulating layer.

2. The semiconductor device of claim 1, wherein the protrusion portion has a larger width than the slit insulating layer.

3. The semiconductor device of claim 1, wherein the slit insulating layer is partially passed into the second pipe channel layer.

4. The semiconductor device of claim 1, wherein the second pipe channel layer has a T shaped cross-section.

5. The semiconductor device of claim 1, wherein the slit insulating layer is extended inside the body portion.

6. The semiconductor device of claim 1, wherein the slit insulating layer is passed through the body portion and is extended into the protrusion portion.

7. The semiconductor device of claim 1, wherein the second pipe channel layer includes a recess on an upper surface of the second pipe channel layer.

8. The semiconductor device of claim 7, wherein the slit insulating layer is filled in the recess.

9. The semiconductor device of claim 1, wherein each of the first and second channel layers has a U-shape.

10. The semiconductor device of claim 1, wherein the first pipe channel layer, the second pipe channel layer, and the slit insulating layer overlap in a stack direction.

11. The semiconductor device of claim 1, further comprising:
an insulating layer interposed between the first pipe gate and the second pipe gate to insulate the first and second pipe gates from each other.

12. A semiconductor device, comprising:
a pipe gate;
source side gate electrodes stacked on the pipe gate;
drain side gate electrodes stacked on the pipe gate;
a pipe channel layer positioned within the pipe gate and including a protruding portion on a lower surface of the pipe channel layer;
a memory layer surrounding the pipe channel layer and the protruding portion, wherein the protruding portion is insulated from the pipe gate by the memory layer;
a source side channel layer connected with the pipe channel layer and passing through the source side gate electrodes; and
a drain side channel layer connected with the pipe channel layer and passing through the drain side gate electrodes.

13. The semiconductor device of claim 12, further comprising:
a slit insulating layer positioned between the source side channel layer and the drain side channel layer, and partially passing through the pipe channel layer.

14. The semiconductor device of claim 13, wherein the pipe channel layer includes a recess on an upper surface of the pipe channel layer, and the recess is filled with the slit insulating layer.

15. The semiconductor device of claim 12, wherein the pipe channel layer includes a body portion and the protruding portion protruded from a lower surface of the body portion.

16. The semiconductor device of claim 15, wherein the pipe channel layer includes a recess on an upper surface of the pipe channel layer, and the recess is extended up to the body portion.

17. The semiconductor device of claim 15, wherein the pipe channel layer includes a recess on an upper surface of the pipe channel layer, and the recess is extended into the protruding portion.

18. A semiconductor device comprising:
a pipe gate:
source side gate electrodes stacked on the pipe gate;
drain side gate electrodes stacked on the pipe gate:
a pipe channel layer positioned within the pipe gate and including a protruding portion on a lower surface of the pipe channel layer;
a memory layer surrounding the pipe channel layer and the protruding portion;
a source side channel layer connected with the pipe channel layer and passing through the source side gate electrodes;
a drain side channel layer connected with the pipe channel layer and passing through the drain side gate electrodes; and
a slit insulating layer positioned between the source side channel layer and the drain side channel layer, wherein the protrusion portion is located below the slit insulating layer.

* * * * *